(12) United States Patent
Marshall et al.

(10) Patent No.: US 6,373,094 B2
(45) Date of Patent: Apr. 16, 2002

(54) EEPROM CELL USING CONVENTIONAL PROCESS STEPS

(75) Inventors: Andrew Marshall; Joseph A. Devore, both of Dallas; Ross E. Teggatz, McKinney; Wayne T. Chen; Ricky D. Jordanger, both of Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/908,024

(22) Filed: Jul. 18, 2001

Related U.S. Application Data

(63) Continuation of application No. 09/151,266, filed on Sep. 11, 1998.

(51) Int. Cl.[7] .............................................. H01L 29/788
(52) U.S. Cl. .................... 257/315; 257/314; 365/185.01
(58) Field of Search ....................... 365/185.01, 185.18; 257/314, 315, 316, 202; 438/257

(56) References Cited

U.S. PATENT DOCUMENTS

| | | | |
|---|---|---|---|
| 5,257,095 A | 10/1993 | Liu et al. ..................... 257/315 |
| 5,258,638 A | 11/1993 | Elhatem et al. | |
| 5,401,992 A | 3/1995 | Ono | |
| 5,457,652 A | 10/1995 | Brahmbhatt ................. 257/315 |
| 5,504,451 A * | 4/1996 | Smayling et al. ........... 327/438 |
| 5,633,186 A | 5/1997 | Shum et al. | |
| 5,635,736 A * | 6/1997 | Funaki et al. ................ 257/401 |
| 5,652,452 A | 7/1997 | Asano ......................... 257/401 |
| 5,677,555 A | 10/1997 | Kalpakjian et al. ......... 257/401 |
| 5,677,876 A | 10/1997 | Tanaka | |
| 5,691,560 A | 11/1997 | Sakakibara | |
| 5,739,576 A | 4/1998 | Shirley et al. | |
| 5,777,361 A | 7/1998 | Parris et al. ................. 257/315 |
| 5,789,791 A | 8/1998 | Bergemont .................. 257/401 |
| 5,907,171 A | 5/1999 | Santin et al. | |
| 6,064,595 A * | 5/2000 | Logie et al. ........... 365/185.18 |
| 6,214,666 B1 * | 4/2001 | Mehta ......................... 438/257 |
| 6,232,631 B1 * | 5/2001 | Schmidt et al. ............. 257/315 |

FOREIGN PATENT DOCUMENTS

| | | | |
|---|---|---|---|
| JP | 363040377 A | * | 2/1988 |
| JP | 407193150 A | * | 7/1995 |

* cited by examiner

*Primary Examiner*—Viet Q. Nguyen
(74) *Attorney, Agent, or Firm*—Peter K. McLarty; W. James Brady, III; Frederick J. Telecky, Jr.

(57) ABSTRACT

An EEPROM cell (10) formed on a substrate (18) using conventional process steps is provided. The cell (10) includes first (12) and second (14) conductive regions in the substrate (18) below the substrate's outer surface (28), and the first (12) and second (14) conductive regions are laterally displaced from one another by a predetermined distance (32). The cell (10) also includes an insulating layer (20) outwardly from the outer surface (28) of the substrate (18) positioned so that its edges are substantially in alignment between the first (12) and second (14) conductive regions. The cell (10) further includes a floating gate layer (22) outwardly from the insulating layer (20) and in substantially the same shape as the insulating layer (20). The cell (10) also includes a diffusion region (24 or 26) that extends laterally from at least one of the first (12) and second (14) conductive regions so as to overlap with the insulating layer (20). The diffusion region (24 or 26) provides a source of charge for placement on the floating gate layer (22) when programming the EEPROM cell (10).

4 Claims, 2 Drawing Sheets

EEPROM CELL USING CONVENTIONAL PROCESS STEPS

This application is a continuation of U.S. application Ser. No. 09/151,266, filed Sep. 11, 1998.

TECHNICAL FIELD OF THE INVENTION

This invention relates in general to the field of electronic devices, and more particularly, to an EEPROM cell that may be manufactured using conventional process steps.

BACKGROUND OF THE INVENTION

The manufacture and use of EEPROMs (Electrically Erasable Programmable Read Only Memory) is well developed and understood. EEPROMs provide a very convenient form of nonvolatile memory that can be programmed, erased, and reprogrammed several thousand times.

EEPROM cells are typically formed from a single metal oxide semiconductor (MOS) transistor on a semiconductor substrate. This transistor usually includes a layer of polysilicon associated with the gate-oxide layer of the transistor. This structure forms a capacitor comprised of the polysilicon layer (first plate), gate-oxide layer (dielectric), and substrate (second plate). The basic goal of an EEPROM cell is to provide a mechanism for placing on or removing from the polysilicon layer charge. The presence or absence of charge on the polysilicon layer associated with the gate determines the digital value of the cell, i.e., a "1" or a "0," respectively.

The placement and removal of the charge from the polysilicon layer requires a source of electrical charge be provided in the vicinity of the polysilicon layer. Several techniques have been previously developed to provide such structures. These include the use of two layers of polysilicon as described in U.S. Pat. No. 4,342,099, issued to Kuo, entitled Electrically Erasable Programmable MNOS Read Only Memory, and U.S. Pat. No. 4,554,643, also issued to Kuo, entitled Electrically Erasable Programmable MNOS Read Only Memory, both of which are assigned to the assignee of the present application. These patents are expressly incorporated by reference for all purposes herein.

Another approach utilizes a single layer of polysilicon with a thin layer of N+ material diffused into the substrate in the polysilicon and gate-oxide region prior to the formation of the polysilicon and gate-oxide layers. The thin layer of charged or doped material below the gate-oxide allows charge to tunnel through the oxide layer and deposit on the polysilicon layer during programming. Because of the tunneling effect, this charge layer is often referred to as the "TUNL" layer. This EEPROM cell has three components, two TUNL capacitors, and an NMOS transistor. One plate of each of the TUNL capacitors and the gate of the NMOS transistor are a blocking piece of polysilicon during the formation of the transistor.

Overall, EEPROM cells have proven to be a very reliable and versatile form of nonvolatile reprogrammable memory. This versatility has contributed to the use of EEPROM cells in devices other than memory devices. For example, EEPROM cells have been used in mixed signal (analog and digital) devices as part of "trimming circuits." Using EEPROM cells in such devices requires that the cell only be programmed a few times, usually at final test, as opposed to requiring programming capability several thousand times for a standard EEPROM cell used in a memory device.

EEPROM cells used in non-memory devices are typically built on a semiconductor substrate that also contains standard CMOS transistors. Because of the structural differences between standard CMOS transistors and EEPROM cells, additional processing steps are required to form the EEPROM cell and the CMOS transistor on the same substrate. These additional steps may add significant cost and time in fabricating the device, often adding as much as 25% more expense to the circuit's fabrication costs. Faced with ever increasing demands for higher yields, at lower cost, with quicker turnaround times, these additional processing steps required to build an EEPROM cell on a substrate along with standard CMOS transistors may be unacceptable.

SUMMARY OF THE INVENTION

Therefore, a need has arisen for an EEPROM cell and method of manufacture that uses conventional process steps.

In accordance with the present invention, an EEPROM cell formed using conventional process steps is provided that substantially eliminates or reduces disadvantages and problems associated with using EEPROM cells and CMOS transistors on a single wafer.

One aspect of the present invention provides an EEPROM cell formed on a substrate having an outer surface. The cell includes first and second conductive regions in the substrate below the substrate's outer surface, and the first and second conductive regions are laterally displaced from one another by a predetermined distance. The cell also includes an insulating layer outwardly from the outer surface of the substrate positioned so that its edges are substantially in alignment between the first and second conductive regions. The cell further includes a floating gate layer outwardly from the insulating layer and in substantially the same shape as the insulating layer. The cell also includes a diffusion region that extends laterally from at least one of the first and second conductive regions so as to overlap with the insulating layer. The diffusion region provides a source of charge for placement on the floating gate layer when programming the EEPROM cell.

Another aspect of the present invention provides a method for forming an EEPROM cell on a substrate having an outer surface. The method includes forming first and second conductive regions in the substrate below the substrate's outer surface with the first and second conductive regions laterally displaced from one another by a predetermined distance. The method also includes forming an insulating layer outwardly from the outer surface of the substrate that is positioned so that its edges are substantially in alignment between the first and second conductive regions. The method also includes forming a floating gate layer outwardly from the insulating layer and in substantially the same shape as the insulating layer. The present method also includes forming a diffusion region that extends laterally from at least one of the first and second conductive regions so as to overlap with the insulating layer. The diffusion region provides a source of charge for placement on the floating gate layer when programming the EEPROM cell.

Another aspect of the present invention provides an EEPROM cell formed on a substrate having an outer surface. The cell includes a deep conductive region in the substrate below the substrate's outer surface. The cell also includes first and second conductive regions in the substrate below the substrate's outer surface, and the first and second conductive regions are laterally displaced from one another by a predetermined distance. The cell includes an insulating layer outwardly from the outer surface of the substrate positioned so that its edges are substantially in alignment between the first and second conductive regions. The cell further includes a floating gate layer outwardly from the insulating layer and in substantially the same shape as the insulating layer. The deep conductive region provides a source of charge for placement on the floating gate layer when programming the EEPROM cell.

Yet another aspect of the present invention provides a method for forming an EEPROM cell on a substrate having an outer surface. The method includes forming a deep conductive region in the substrate below the substrate's outer surface. The method also includes forming first and second conductive regions in the substrate below the substrate's outer surface with the first and second conductive regions laterally displaced from one another by a predetermined distance. The method further includes forming an insulating layer outwardly from the outer surface of the substrate positioned so that its edges are substantially in alignment between the first and second conductive regions. The method also includes forming a floating gate layer outwardly from the insulating layer and in substantially the same shape as the insulating layer. The deep conductive region provides a source of charge for placement on the floating gate layer when programming the EEPROM cell.

The present invention provides several technical advantages. An important technical advantage of the present invention is that it provides an EEPROM cell and method of manufacture that uses standard CMOS processing techniques. This results in an EEPROM cell that provides reliable programming for its application. This EEPROM cell and method of manufacture uses standard CMOS processing steps, eliminating the need for special and additional processing steps required when EEPROM cells and CMOS transistors are placed on a single substrate.

An additional technical advantage of the present invention is that it provides an EEPROM cell and method of manufacture that provides a cost savings over previous process steps for manufacturing EEPROM cells and standard CMOS transistors on a single substrate.

Another technical advantage of the present invention is that it reduces the processing time for forming an EEPROM cell on a semiconductor substrate that also contains standard CMOS transistors.

BRIEF DESCRIPTION OF THE DRAWINGS

For a more complete understanding of the present invention and advantages thereof, reference is now made to the following description taken in conjunction with the accompanying drawings, in which like reference numbers indicate like features and wherein.

DETAILED DESCRIPTION OF THE INVENTION

Preferred embodiments of the present invention are illustrated in the figures, like numerals being used to refer to like and corresponding parts of the various drawings.

Standard EEPROM cells typically include a polysilicon layer outwardly from a gate-oxide layer, which is outwardly from the semiconductor substrate. Typically, the thickness of the gate-oxide is very thin, generally on the order of, for example, 100 Å. This thin gate-oxide layer allows charge from the substrate to be deposited and removed from the polysilicon layer, i.e., programmed, several thousand times without suffering any degradation in the programmability of the cell. As the thickness of the gate-oxide increases, however, the ability to remove and place charge on the polysilicon layer through the oxide layer decreases, which, in turn, affects the reliability of the device. Because the thickness of the gate-oxide layer in an EEPROM cell is directly related to the reprogrammability of the EEPROM cell, this thickness is very important. The thicker the gate-oxide level, the less times the cell may be programmed, and conversely, the thinner the gate-oxide layer, the more times the EEPROM cell may be programmed.

As previously mentioned, standard CMOS transistors also have a gate-oxide layer. In standard CMOS processing techniques, the gate-oxide layer is typically on the order of 200 Å, which is significantly thicker than the gate-oxide layer used for forming a standard EEPROM cell. Therefore, an EEPROM cell formed with the standard thicker CMOS gate-oxide layer can be programmed reliably only a limited number of times as compared to standard EEPROM cells. Fortunately, certain applications of EEPROM cells, for example, as trimming circuits as previously described, require only a few programming cycles be available from the EEPROM cell. Therefore, since a fewer number of programming cycles is required in such applications, the EEPROM cell may be fabricated using standard CMOS processing techniques and results in an EEPROM cell having a thicker gate-oxide layer than for conventional EEPROM cells. The present invention, therefore, provides the advantages of an EEPROM cell while using standard CMOS processing techniques and does not require additional processing steps to form the EEPROM cell.

Figure 1A:
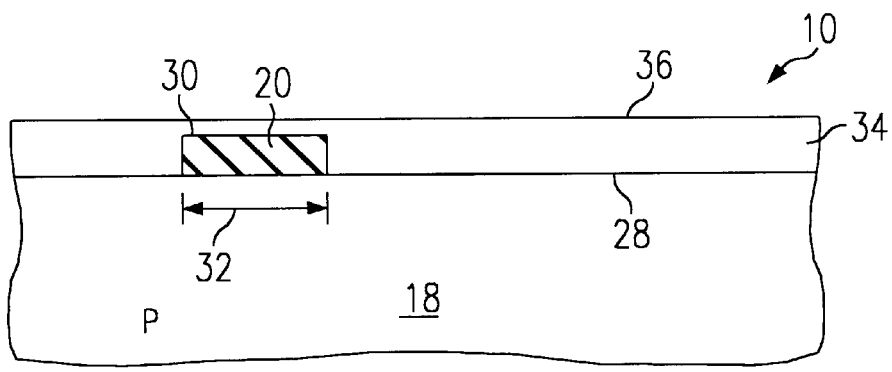
FIGS. 1A through 1C illustrate in cross-section the formation of an EEPROM cell embodying concepts of the present invention.
Figure 1B:
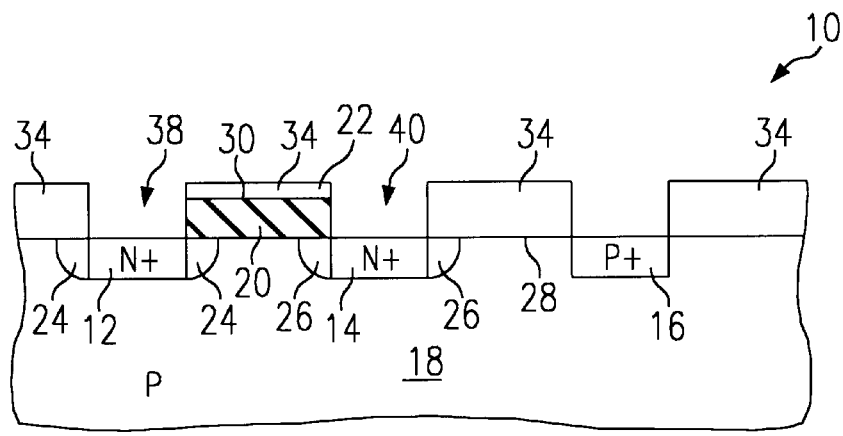
Figure 1C:
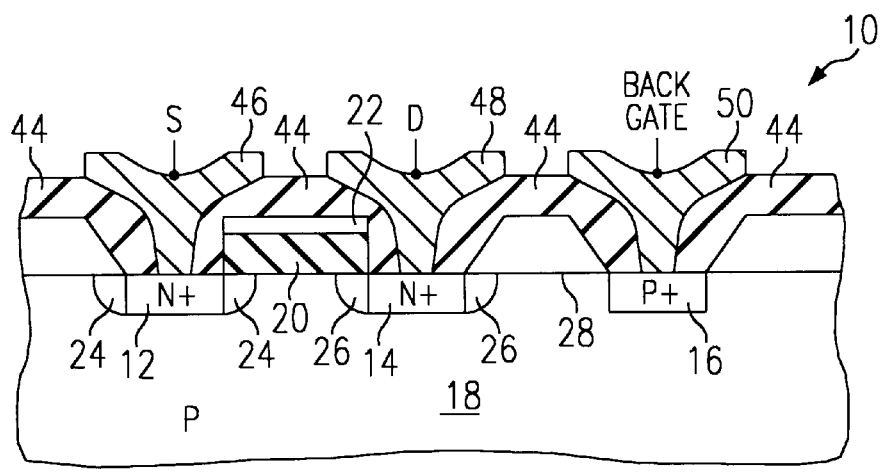

FIGS. 1A–1C illustrate an EEPROM cell and method of manufacture using conventional CMOS processing steps. FIG. 1C shows completed EEPROM cell 10. EEPROM cell 10 includes first conductive region or source 12, second conductive region or drain 14, and back-gate 16 formed in semiconductor substrate 18. Like most EEPROM cells, EEPROM cell 10 includes a programming structure comprising an insulating layer or gate-oxide 20 and floating gate layer of polysilicon layer 22, both of which are formed outwardly from semiconductor substrate 18. Hereinafter, the first conductive region will be referred to as source 12, the second conductive region will be referred to as drain 14, the insulating layer will be referred to as gate-oxide 20, and the floating gate layer will be referred to as polysilicon layer 22, it being understood that these names are not intended to limit the scope and spirit of the present invention.

EEPROM cell 10 is programmed by placing a charge on polysilicon layer 22. In order to apply a charge to polysilicon layer 22, a voltage is applied to polysilicon layer 22, causing the attraction of charge to layer 22. By reversing the potential applied to polysilicon layer 22, the charge may be removed from layer 22. This also requires that a source of charge be provided from the structures below gate-oxide 20.

In the EEPROM cell 10 of the present invention, the N+ regions of source 12 and drain 14 provide the source of charge for the programming of EEPROM cell 10. As shown in FIG. 1C, source region 12 includes diffusion regions 24; and drain 14 includes drain diffusion regions 26. These N+ regions extend from source 12 and drain 14 under gate-oxide layer 20 and polysilicon layer 22 and provide a source of charge for deposit on polysilicon layer 22. By providing charge from source diffusion region 24 and drain diffusion region 26 in EEPROM cell 10, the need for forming a separate layer capable of providing the charge is eliminated, and thereby minimizes the cost and time associated with the formation of EEPROM cell 10 over conventional EEPROM cells.

FIG. 1A illustrates a starting point for the manufacture of EEPROM cell 10 of the present invention. The starting material is, for example, a wafer of P-type monocrystalline silicon typically 8 inches in diameter and 20 mils thick, but on the <100> plane, of a resistivity of about 14 ohm-cm. The portion of polysilicon substrate 18 shown in the FIGUREs is only a very small part of substrate 18. After appropriate cleaning, a gate-oxide layer 20 is formed outwardly from surface 28 of substrate 18 using conventional processing techniques. The thickness of oxide layer 30 is on the order of, for example, 100 Å. Using appropriate lithography and oxidation techniques, gate-oxide layer 20 is formed of desired width 32. Width 32 of gate-oxide layer 20 is typically on the order of, for example, 1 micron or smaller.

It is noted that the formation of gate-oxide layer 20 of EEPROM cell 10 may be formed concurrently with the formation of the gate-oxides of standard CMOS transistors also located on substrate 18. This eliminates the need for special processing steps that were required to build conventional thinner, gate-oxide EEPROM cells on the same substrate.

Next, polycrystalline layer 34 is deposited outwardly from substrate surface 28 and gate-oxide layer surface 30 over the entire exposed surfaces. The thickness of polycrystalline layer 34 varies from, for example, on the order of 100 to 200 Å over gate-oxide layer 20 and up to on the order of 5,000 Å over the remainder of substrate surface 28. The top surface 36 of polycrystalline layer 36 may then be planarized using standard planarization techniques to ensure that surface 36 is planar.

Next, polysilicon layer 34 must be patterned using conventional photolithographic techniques. A photoresist layer is deposited on surface 36 of polycrystalline layer 34, masked, exposed, and developed, leaving a desired pattern on polycrystalline layer 34. Then, using an appropriate etching technique, the unmasked polycrystalline silicon is etched away, resulting in the gate-oxide layer 20 and polysilicon layer 22 structure shown in FIG. 1B.

FIG. 1B shows polycrystalline layer 34 having source opening 38 and drain opening 40, which provide a key feature to the formation of EEPROM cell 10 of the present invention. With openings 38 and 40 formed in polycrystalline layer 34, a self-aligning region for the diffusion of N-type material to form source 12 and 14 is provided by polysilicon layer 34. This eliminates the necessity for additional masking steps for the formation of these N+ regions.

The N+ regions may be formed by diffusing an N-type material, such as phosphorous, through openings 38 and 40 through substrate surface 28 and into substrate 18. High concentrations of N-type material, on the order of, for example, $1 \times 10^{16}$ to $1 \times 10^{18}$ cm$^{-3}$ should be used to form source 12 and drain 14 regions, by allowing the diffusion of N+ regions 12 and 14 to proceed a sufficient amount of time and by using a high concentration of N-type diffusion material, this N+ material of regions 12 and 14 will diffuse laterally under polysilicon layer 34, forming source diffusion regions 24 and drain diffusion regions 26 as described in discussions relating to FIG. 3C. It is noted that diffusion regions 24 and 26 may be formed in a separate process step to or simultaneously with the formation of source 12 and drain 14. Additionally, it is noted that cell 10 may be built with one of diffusion regions 24 and 26 provided sufficient lateral diffusion from the one region occurs.

As previously stated, width 32 for gate-oxide layer 20 and polysilicon layer 22 is typically on the order of, for example, 1 micron. Using appropriate diffusion concentrations, temperatures, and time, source diffusion region 24 and drain diffusion region 26 will each diffuse underneath gate-oxide 20 and polysilicon layer 22 on the order of, for example, up to 0.4 microns from each region. This results in an N+ region under gate-oxide layer 20 and polysilicon layer 22 of sufficient area to provide the charge for programming polysilicon layer 22 when necessary.

Next, and returning to FIG. 1B, P+ region 16 for backgate 16 is formed. This is accomplished by an appropriate masking, exposing, developing, and etching process through polysilicon layer 34, followed by the diffusion of a P+ material, such as boron at a concentration on the order of, for example, $1 \times 10^{18}$ cm$^{-3}$ into substrate 18. Once P+ region 16 is formed in substrate 18, the structure shown in FIG. 1B is complete.

FIG. 1C, as previously described, shows completed EEPROM cell 10. Following the formation of the structures shown in FIG. 1B, field oxide layer 44 is formed outwardly from surface 30 of polysilicon layer 34, source 12, drain 14, and back-gate P+ contact 16 using standard techniques. This field oxide layer is then appropriately patterned and removed using standard photolithography techniques resulting in the desired openings in field oxide layer 44. These openings allow source metal layer 46, drain metal layer 48, and back-gate metal layer 50 to be formed outwardly from and through field oxide layer 44 to make contact with source 12, drain 14, and back-gate 16, respectively.

Important to the formation of EEPROM cell 10 in FIG. 1 are source diffusion regions 24 and drain diffusion regions 26. It is important that these regions extend laterally far enough under gate-oxide layer 20 and polysilicon layer 22 so that a sufficient amount of charge is provided to or removed from polysilicon layer 22 during programming. In order to ensure the required amount of lateral diffusion in source diffusion region 24 and drain diffusion region 26, it is important to maximize the edge length of polysilicon layer 22 and gate-oxide layer 20 with respect to the N+ regions of source 12 and drain 14. This can be accomplished by several methods, which basically involve forming gate-oxide layer 20 and polysilicon layer 22 in a pattern that increases the amount of edge length of these layers with respect to the N+ regions of source 12 and drain 14.

Figure 2:
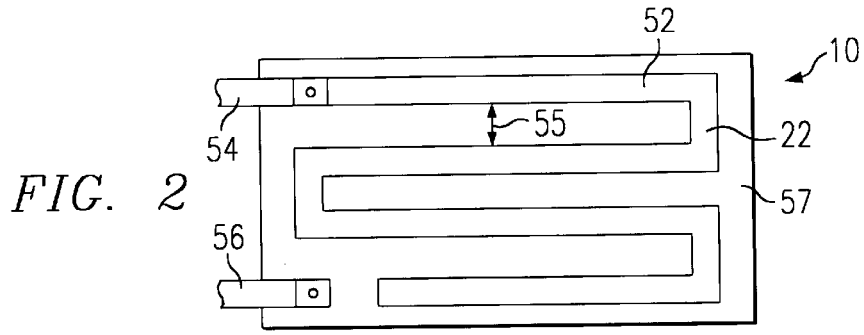
FIG. 2 shows a top view "snake" layout of the polysilicon layer in N-type material for the present EEPROM cell.

FIG. 2 shows snake pattern 52 for polysilicon layer 22 in a top-view of a portion of EEPROM cell 10. It is noted that gate-oxide layer 20 is formed below polysilicon layer 22, and generally matches the pattern of polysilicon layer 22. The portion of EEPROM cell 10 shown in FIG. 2 includes metal contact to polysilicon 54 and metal contact to N+ 56. Contact 54 is used to provide a voltage to polysilicon layer 22 during programming. Metal contact to N+ 56 corresponds to either source metal layer 46 or drain metal layer 48 as shown in FIG. 1C.

For a typical process step where polysilicon width 32, as shown in FIG. 1A, is on the order of 1 micron and polysilicon spacing 55 is on the order of 1 micron, the snake configuration of polysilicon layer 22 shown in FIG. 2 has approximately 13 times more periphery than a square shaped polysilicon layer 22. This increase in edge periphery allows source diffusion region 24 and drain diffusion region 26 to provide a source of charge for the programming of polysilicon layer 22.

Figure 3:
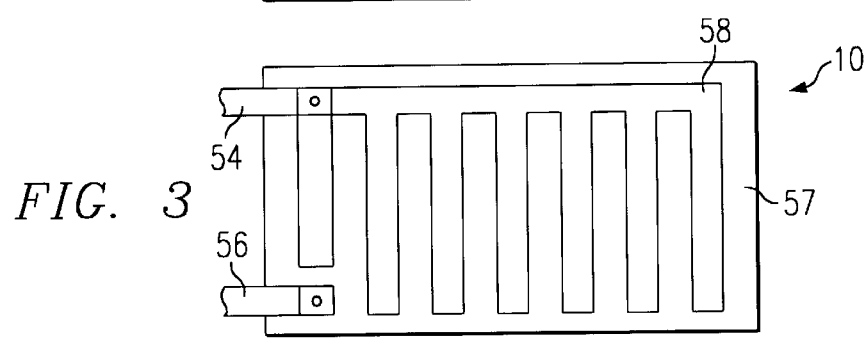
FIG. 3 illustrates a top view "comb" layout of the polysilicon layer in N-type material for the present EEPROM cell.
Figure 4:
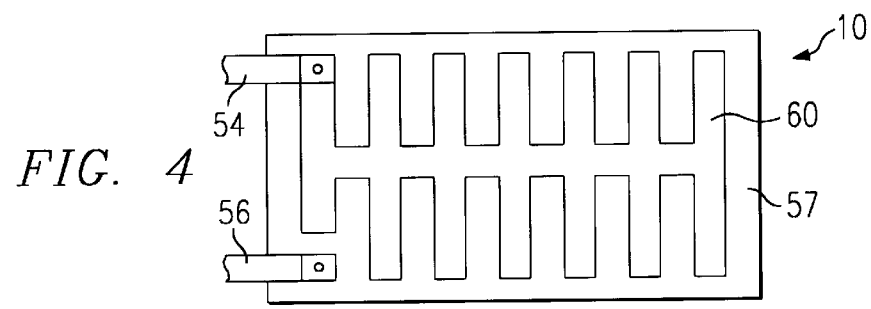
FIG. 4 provides a top view "fishbone" layout of the polysilicon layer in N-type material for the present EEPROM cell.

FIG. 3 shows an alternate configuration for polysilicon layer 22 in comb pattern 58. Additionally, FIG. 4 shows another configuration for polysilicon layer 22 in fishbone pattern 60.

Figure 5:
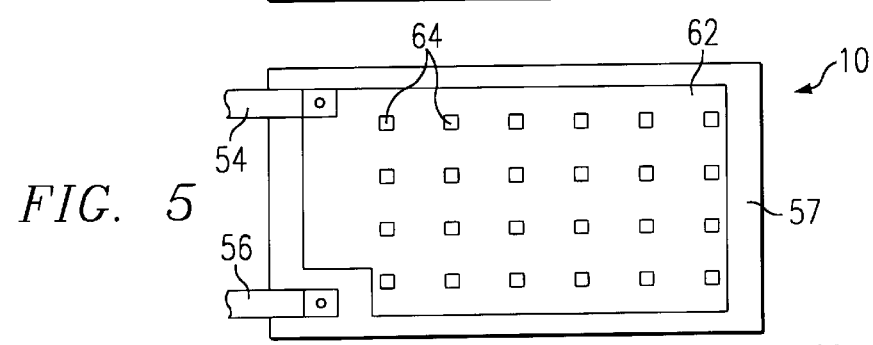
FIG. 5 depicts a top view "waffle" layout of the polysilicon layer in N-type material for the present EEPROM cell.

FIG. 5 shows waffle polysilicon layer pattern 62 formed outwardly from N-type region 57. Formed within waffle pattern 62 are N+ regions 64, which also provide charge for the programming of polysilicon layer 22 when in waffle pattern 62.

It is noted that the pattern of polysilicon layer 22 is not limited to those shown in FIGS. 2 through 5. The basic concept is to increase the edge periphery interface between polysilicon layer 22 and the N+ regions of the source 12 and drain 14 so that charge may be deposited on polysilicon layer 22 during programming.

For the configuration patterns shown in FIGS. 2 through 5, waffle pattern 62 typically provides the same or very slightly more periphery than snaked 52, comb 58, or fishbone 60 patterns and has the advantage that the capacitance formed by the polysilicon, gate-oxide, and N+ region is not distributed down a long length of polysilicon layer 22. Fishbone pattern 60 optimizes the polysilicon and N-type resistances and interfaces.

Figure 6:
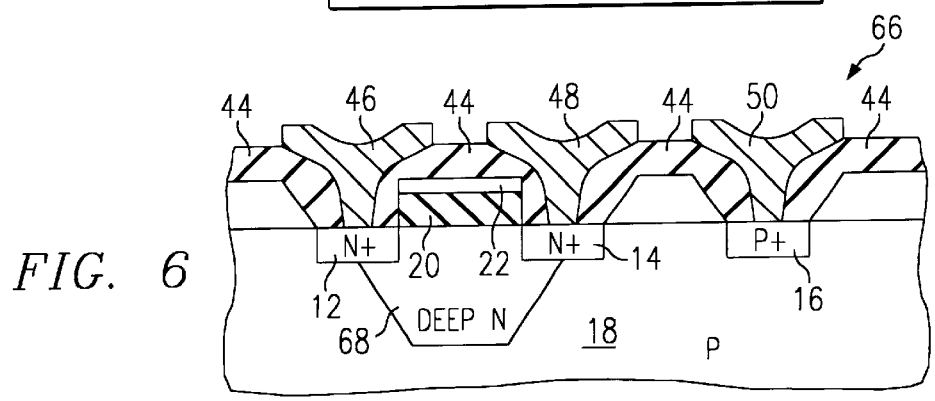
FIG. 6 shows in cross-section an alternative configuration of the present EEPROM cell employing a deep-N diffusion.

FIG. 6 shows an alternate embodiment for the present EEPROM cell that may be formed using conventional process steps. EEPROM cell 66 is nearly equivalent to EEPROM cell 10 as shown in FIGS. 1A through 1C, and has gate-oxide layer 20 and polysilicon layer 22 that may be formed using conventional CMOS processing and techniques. This provides EEPROM cell 66 with the same advantages previously noted for EEPROM cell 10.

In order to provide a source of charge for polysilicon layer 22, deep-N diffusion region 68 is formed prior to the formation of the structures of EEPROM cell 66 as the first step in the processing of substrate 18. Deep-N region 68 may be formed using typical power CMOS processing to diffuse an N-type material, typically phosphorous at a concentration on the order of, for example, $1 \times 10^{16}$ $cm^{-3}$ and extends generally on the order of 7 microns into substrate 18. Once deep-N region 68 is formed, the remaining structures of EEPROM cell 66 may be fabricated using standard semiconductor processing techniques as was previously in discussions relating to FIGS. 1A through 1C.

The present EEPROM cell and method of manufacture provide several technical advantages. A key technical advantage of the present EEPROM cell and method of manufacture is that it may be formed using standard semiconductor processing techniques. This allows the EEPROM cell to be formed on a substrate that also contains standard CMOS transistors without the need for additional processing techniques or steps. This helps minimize the cost and processing time of the EEPROM cell. An additional technical advantage of the present EEPROM cell and method of manufacture is that it results in an EEPROM cell that provides reliable programming capability.

Although the present invention has been described in detail, it should be understood that various changes, substitutions, and alterations can be made hereto without departing from the spirit and scope of the invention as defined by the appended claims.

We claim:

1. An EEPROM cell formed on a substrate of a first conductivity type having an outer surface, comprising:

first and second conductive regions formed of a second conductivity type different from said first conductivity type and in the substrate below the outer surface of said substrate, the first and second conductive regions are laterally displaced from one another by a first distance;

an insulating layer formed outwardly from the outer surface of the substrate, the insulating layer positioned so that its edges are substantially in alignment between the first and second conductive regions of a second conductivity type;

a floating gate layer outwardly from the insulating layer and in substantially the same shape as the insulating layer wherein a voltage is applied to the floating gate layer to program the EEPROM cell;

a deep contiguous conductive region formed of said second conductivity type in the substrate below the substrate's outer surface, adjacent to substantially the entire insulating layer and said first and second conductive regions formed of a second conductivity type; and wherein the deep contiguous conductive region is operable to provide a source of charge for placement on the floating gate layer when programming the EEPROM cell.

2. The EEPROM cell of claim 1 wherein the insulating layer is formed from oxide.

3. The EEPROM cell of claim 1 wherein the floating gate layer is formed from polysilicon.

4. The EEPROM cell of claim 1 wherein the deep conductive region is doped N+ on the order of $1 \times 10^{16}$ $cm^{-3}$.

* * * * *